United States Patent
Heremans et al.

(10) Patent No.: US 7,468,328 B2
(45) Date of Patent: Dec. 23, 2008

(54) METHOD FOR PRODUCING PATTERNED THIN FILMS

(75) Inventors: Paul Heremans, Leuven (BE); Dimitri Janssen, Sint-Niklaas (BE); Sören Steudel, Dresden (DE); Stijn Verlaak, Landen (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 473 days.

(21) Appl. No.: 10/885,220

(22) Filed: Jul. 6, 2004

(65) Prior Publication Data
US 2005/0014350 A1 Jan. 20, 2005

Related U.S. Application Data

(60) Provisional application No. 60/485,087, filed on Jul. 3, 2003, provisional application No. 60/485,088, filed on Jul. 3, 2003.

(51) Int. Cl.
*H01L 21/31* (2006.01)
*H01L 21/20* (2006.01)
*H01L 21/36* (2006.01)
*H01L 21/336* (2006.01)

(52) U.S. Cl. .................. 438/778; 438/478; 438/481; 438/257

(58) Field of Classification Search ............ 438/778, 438/489, 257, 481, 484, 478
See application file for complete search history.

(56) References Cited

U.S. PATENT DOCUMENTS 5,364,815 A * 11/1994 Osada .................. 438/489
5,677,226 A * 10/1997 Ishitani ...................... 438/3
5,915,194 A * 6/1999 Powell et al. .............. 438/478
6,273,949 B1 * 8/2001 Eyres et al. .................. 117/94
6,620,710 B1 * 9/2003 Kamins ..................... 438/479
7,118,929 B2 * 10/2006 Frayssinet et al. ............ 438/22
2003/0089899 A1 * 5/2003 Lieber et al. ................. 257/9
2004/0144301 A1 * 7/2004 Neudeck et al. ............ 117/86

OTHER PUBLICATIONS

Timothy Trentler, et al., *Solution-Liquid-Solid Growth of Crystalline III-V Semiconductors; An Analogy to Vapor-Liquid-Solid Growth*, Science, vol. 270, pp. 1791-1794, Dec. 15, 1995.

M. G. Kane, et al., Analog and Digital Circuits Using Organic Thin-Film Transistors on Polyester Substrates, IEEE Electron Device Letters, vol. 21, No. 11, pp. 534-536, Nov. 2000.

(Continued)

*Primary Examiner*—Chuong A. Luu
(74) *Attorney, Agent, or Firm*—McDonnell Boehnen Hulbert & Berghoff LLP

(57) ABSTRACT

The present invention relates to methods for producing a patterned thin film on a substrate. The method comprises the spatially and possibly also temporally modulation of nucleation modes of film growth during the growth of patterned thin films. The nucleation modes are modulated between no or substantially no nucleation, 2D nucleation, and 3D nucleation. The modulation is obtained by adjusting the surface treatment spatially applied over regions of the substrate, the growth conditions for the thin film materials used, and/or the specific thin film materials used. The growth conditions typically comprise the substrate temperature and the deposition flux. The modulation allows for spatially varying the interaction between the substrate material and the thin film materials deposited.

25 Claims, 4 Drawing Sheets

OTHER PUBLICATIONS

Nir Tessler, *Lasers Based on Semiconducting Organic Materials*, Advanced Materials, vol. 11, No. 5, pp. 363-370, 1999.

Zhenan Bao, et al., *Printable organic and polymeric, semiconducting materials and devices*, Journal of Materials, Chemistry, 9, pp. 1895-1904, Jun. 14, 1999.

V.G. Kozlov, et al., *Laser action in organic semiconductor waveguide and double-heterostructure devices*, Nature, vol. 389, pp. 362-364, Sep. 25, 1997.

Hagen Klauk, et al., *Fast Organic Thin-Film Transistor Circuits*, IEEE Electron Device Letters, Vo. 20, No. 6, pp. 289-291, Jun. 1999.

I. H. Wilson et al., "*The expitaxial growth of compound semiconductors observed by atomic force microscopy*", Inst. Phys. Conf. Ser. No. 146, paper presented at Microscopy of Semiconducting Materials Conference, Oxford (Mar. 20-23, 1995).

K. Kushida et al., "*Initial stage of Ag growth on Ge(001) surfaces at room temperature*", Surface Science Elsevier Netherlands, vol. 442 No. 2, pp. 300-306 (Sep. 1999).

R. Ruiz et al., *Pentacene ultrathin film formation on reduced and oxidized Si surfaces*, Physical Review B, vol. 67 No. 12, pp. 125406-1-7 (Mar. 12, 2003).

Yi Luo et al., "*Fractal-compact island transition and self-limiting growth of pentacene on polymers*", Abstract, Institution of Electrical Engineers, vol. 537 No. 1-3, pp. 241-246 (Jul. 1, 2003).

S. Verlaak et al., "*Nucleation of organic semiconductors on inert substrates*", Abstract, Institution of Electrical Engineers, vol. 68 No. 19, pp. 195409-1-11 (Nov. 15, 2003).

European Search Report for EP 04 01 5799, application of Interuniversitair Micro-Elektronica Centrum, dated Jan. 18, 2005.

\* cited by examiner

METHOD FOR PRODUCING PATTERNED THIN FILMS

PRIORITY

The present patent application claims priority under 35 U.S.C. § 119(e) to U.S. Provisional Patent Application Ser. No. 60/485,087; filed on Jul. 3, 2003, titled "Method for Producing Patterned Thin Films" and to U.S. Provisional Patent Application Ser. No. 60/485,088; filed on Jul. 3, 2003, titled "Nucleation of Organic Semiconductors on Inert Substrates." The full disclosures of U.S. Provisional Patent Application Ser. No. 60/485,087 and U.S. Provisional Patent Application Ser. No. 60/485,088 are incorporated herein by reference.

FIELD

The present invention relates to semiconductor processing technology, more specifically to the field of producing patterned films on a substrate as well as devices including the films made by the method.

BACKGROUND

Several applications in processing technology require patterned thin films having properties that vary laterally along the film and/or properties that vary over the film thickness. A common way to achieve such patterned films is by deposition of a thin film on a substrate and subsequent removal of parts of the thin film of some of the locations of the substrate onto which the film was grown. In this way, parts of the substrate—where the thin film, having a specific property, has been removed—may have a first characteristic while other parts of the substrate—where the thin film having that specific property has not been removed—may have a second characteristic.

Furthermore, it is sometimes required that a second film is deposited on the same substrate after depositing and patterning the first film, such that the properties of the second film will be present at those parts of the substrate where the first film was removed. Furthermore it is possible that not the bulk property of the second film is of interest, but rather its interfacial properties at the interface with the first film. In the following, examples are given of the use of a patterned thin film in several applications.

A first example concerns the use of a patterned thin film for selecting conductive areas. Conductivity (e.g., electrical conductivity, heat conductivity, etc.) is not only a material property, but is for a certain material, also influenced by the morphology of the thin film studied. These materials include films that consist of ill-connected grains will badly conduct and films that consist of not-connected grains will not conduct at all. Selection of conductive areas using patterned thin films finds application in organic Thin Film Transistors (OTFTs), for example.

OTFTs are field-effect transistors having an organic semiconductor thin film as active semiconducting layer. Often, this thin film is a polycrystalline layer of organic small molecules, such as pentacene, oligothiophenes, phthalocyanines, and so on. In addition, organic semiconductor thin films are often unintentionally doped and therefore contain free majority charge carriers. Those properties can lead to a deficient behavior of circuits.

Generally, a TFT has an ohmic source and drain contacts to permit easy injection of charges into the semiconductor, so as to be able to sustain a high current. If a TFT works in an accumulation regime, meaning that majority charge carriers are used to form a current, several TFTs can be connected to each other not only by interconnects, but also by the common semiconductor thin film. The ohmic contacts can inject charges into the semiconductor film at any point and can form leakage currents between different TFTs working in accumulation.

The unintentional doping thus leads to a higher conductivity of the organic thin film and will increase the magnitude of the leakage currents. The dynamic range of the transistor (i.e., the ratio of the on-current to the off-current) will be limited by the higher off-current due to the stray currents in the semiconductor film outside the TFT. Using a patterned semiconductor film, such that only the active area inside the TFT can conduct current, would increase the dynamic range and reduce the leakage current in a series of different TFTs.

While solution-processable organic semiconductors can be selectively deposited only on the active areas of electronic devices, (e.g., by inkjet printing or screen printing techniques as described by Bao et al. in J. Mater. Chem. 9 (1999) 1895) other non-soluble semiconductors cannot make use of those techniques. Particularly semiconductors that are deposited as crystalline or polycrystalline films in vacuum, as the ones mentioned above, cannot make use of those techniques. They have to be patterned by other means.

Shadow masking while depositing in vacuum is one possibility described by Baude et al., yet shadow masking has a very low dimensional and alignment accuracy. Patterning of the semiconductor film after deposition by using photolithographic techniques has been demonstrated by e.g. Kane et al. in IEEE El. Dev. Lett. 21, (2000) 534. However, organic semiconductors are very sensitive to solvents and even to water, which limits the use of photoresists or else compromises at least part of the performance of the organic semiconductor. In addition, photolithography can limit applications of organic electronics where flexibility in design is required, such as circuits on demand, because they require photolithographic masks with fixed circuit designs.

Integrated shadowmasks are demonstrated by Klauk et al. in IEEE El. Dev. Lett. 20 (1999) 289 in which a relief is fabricated on the substrate by photolithography prior to the deposition of the thin film. The relief will then break the continuity of the film during deposition. Although the organic semiconductor is not exposed to any solvents in this technique, several processing steps are still required increasing the cost of the process, and the photolithographic process again constrains the flexibility of circuit design and fabrication.

In a second example, thin film patterning is used to obtain a patterned refractive index profile to create a waveguide for light. Waveguiding of light is a prominent problem in organic lasers for example. Organic lasers often use a slab waveguide to confine the light in the organic light-emitting film, as described by Kozlov et al. in Nature 289 (1997) 362. However, only the light that is able to stimulate emission in the direction of the optical feedback structure is used efficiently in the laser. If all light emitted in the organic layer could be waveguided along the direction of the optical feedback structure, the threshold for stimulated emission may be lowered.

To waveguide light in a certain pattern on the substrate, the material in which the light is waveguided should have a higher refractive index than the surrounding material. Films with a patterned refractive index can also be used to make a distributed Bragg reflector as optical feedback in organic lasers as described by Tessler et al. in Adv. Mater. 11 (1999) 363. Moreover, it would also be useful if other properties could be spatially patterned, like the optical bandgap, the electron affinity, and the ionization potential.

A third example where patterning can be used, is in bulk hetero-junction solar cells where the interfacial properties of two materials are of importance as discussed by Yu et al. in Science, 270 (1995) 1789. The concept is to increase the interfacial area between a donor and an acceptor material, where exciton dissociation will occur. Both donor and acceptor material need to have crossed the percolation threshold, such that the hole from the dissociated exciton can be transported out of the film, and the electron can be transported out of the film.

Usually the increase of the interfacial area occurs by a random pattern in the film, usually by blending two solution-processable materials, but the bulk hetero-junction principle is not limited to this. One of the problems with the bulk hetero-junction solar cell fabricated by blending the donor and acceptor is that there is little control on the percolation of both donor and acceptor molecules. In addition, there is also little control on the interfacial area due to aggregation of the molecules. A more broad and improved application could be obtained if improved patterned films can be used.

In the above-mentioned examples, the techniques for patterning thin films are restricted to specific materials, such as solution-processable materials, which limit the flexibility of the design. Furthermore, the above-mentioned techniques for patterning thin films have a low dimensional and alignment accuracy, are less suitable to be used with organic semiconductors, increase the cost, and/or compromise at least a part of the performance of the materials in the devices made.

SUMMARY

It is an object of the present invention to provide a method for patterning films without restrictions on the film materials used. It is furthermore an object of the present invention to provide a method for patterning films without limitations on the performance of the patterned film material. The above objectives are accomplished by a method according to the present invention.

The present invention relates to a method for the production of a patterned thin film on a substrate, the thin film comprising at least one thin film material. The method comprises, during growth of the thin film, modulating a nucleation mode of the at least one thin film material between no or substantially no nucleation, 2D nucleation, and 3D nucleation.

Modulating the nucleation mode may comprise spatially modulating the nucleation mode of the at least one thin film material.

The modulating may be performed as a function of at least one of the parameters selected from the group of surface treatment, choice of the at least one thin film material, and growth conditions. In other words, a variation of at least one of these parameters is chosen in order to obtain different nucleation modes under these variations.

The growth conditions may comprise the substrate temperature $T_{sub}$ and the deposition flux $\Phi$.

Modulating also may comprise treating a first region of the substrate with a surface treatment, depositing a first thin film material onto the substrate under a first set of growth conditions, and depositing a second thin film material onto the substrate under a second set of growth conditions. The surface treatment, the first thin film material, the first set of growth conditions, the second thin film material, and the second set of growth conditions may be chosen such that the first thin film material grows according to a first nucleation mode in the first region of the substrate and the second thin film material grows according to a second nucleation mode in a second region of the substrate, the second region being at least the area of the substrate outside the first region.

The first material may grow according to 3D nucleation and the second material may grow according to 2D nucleation. The area of 2D nucleation may consist of the zone on the substrate located between the 3D nuclei formed by the surface treatment step. Each of the first nucleation mode and the second nucleation mode may be any of no or substantially no nucleation, 2D nucleation, and 3D nucleation. The second nucleation mode may differ from the first nucleation mode.

The first region may comprise randomly spread locations over the substrate. Interface areas may exist between the first regions and the second regions, the interface areas functioning as emitter areas in a solar cell device, for example.

The sets of growth conditions each may comprise a substrate temperature $T_{sub}$ and a deposition flux $\Phi$. The sets of growth conditions furthermore may each comprise a deposition time t. The first set of growth conditions and the second set of growth conditions may be such that they comprise the same substrate temperature. The first set of growth conditions and the second set of growth conditions may be such that they comprise the same deposition flux. The first set of growth conditions and the second set of growth conditions may be such that they comprise the same deposition time.

The first thin film material and the second thin film material may be the same thin film material. The first thin film material and the second thin film material may be deposited at the same time.

Modulating the nucleation mode may comprise temporally modulating the nucleation mode of the at least one thin film material.

The substrate comprises at least one substrate material. The modulating may comprise dividing the substrate into a plurality N of physical regions, treating each of the physical regions in a different way, the treating influencing the interaction between each of the physical regions and each of the at least one thin film materials differently for each of the physical regions, and depositing thin film material on the substrate under predetermined deposition conditions.

According to the present invention, the at least one substrate material, the different treatments of the physical regions of the substrate, the at least one thin film material and the growth conditions may be chosen such that in different physical regions different nucleation modes occur. The nucleation modes may be selected from the group consisting of no or substantially no nucleation, 2D nucleation and 3D nucleation. Each physical region may comprise different connected or non-connected locations on the substrate.

The number of different physical regions may be two or more.

The at least one substrate material, the different treatments of the regions, the at least one thin film material, and the growth conditions may be chosen such that the difference in substrate—thin film material interaction between two regions is maximized.

The growth conditions may comprise substrate temperature and deposition flux.

The treatment of the regions of the substrate may comprise the choice of the at least one substrate material. In other words, the treatment may comprise the choice of a certain substrate material or a group of part-substrate materials.

The nucleation modes may be selected from the group consisting of 2D nucleation and 3D nucleation. The nucleation modes may be selected from the group consisting of 3D nucleation and no or substantially no nucleation. The nucleation modes may be selected from the group consisting of 2D nucleation and no or substantially no nucleation.

Thin film materials grown according to 3D nucleation or according to no or substantially no nucleation may form a non-conductive thin film region and thin film materials grown according to 2D nucleation may form a conductive thin film region. A conductive thin film region can be thermally conductive, electrically conductive, or light conducting. In other words, 3D nucleation or no or substantially no nucleation may result in a no current conduction structure, and 2D nucleation may imply a current conduction structure in the corresponding region.

The surface of the substrate on which growth is performed may be flat. The surface of the substrate on which growth is performed may have a non-flat topology. The substrate may comprise different parts or sub-substrates, possibly being made of different materials and joined together. The substrate material may comprise an organic semiconductor material, a metal, a dielectric material, an electrically isolating material, a glass, a polyester, or a transparent conductive oxide.

The patterned thin film may be crystalline or polycrystalline. The thin film material may be bound by Van der Waals forces. The thin film material may be bound covalently. The thin film material may be an organic material. The thin film material may be a semiconductor material. The thin film material may be an organic semiconductor material. The organic semiconductor material may comprise small organic molecules. The small organic molecules may crystallise in a herringbone or sandwich herringbone packing. The thin film material may allow good charge transport in the crystal plane parallel to the substrate. The thin film material may allow good charge transport in the crystal, substantially perpendicular to the substrate.

The invention also relates to a patterned thin film produced on a substrate according to any of the methods described above and apparatus such as electronic devices including the thin film.

It is a specific advantage of the present invention that the method can be used for organic materials such as small molecule organic semiconductors.

Although there has been constant improvement, change and evolution of methods in this field, the present concepts are believed to represent substantial new and novel improvements, including departures from prior practices, resulting in the provision of more efficient, stable and reliable devices of this nature.

The teachings of the present invention permit the design of improved methods for producing patterned films. The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figures 1A, 1B, 1C:
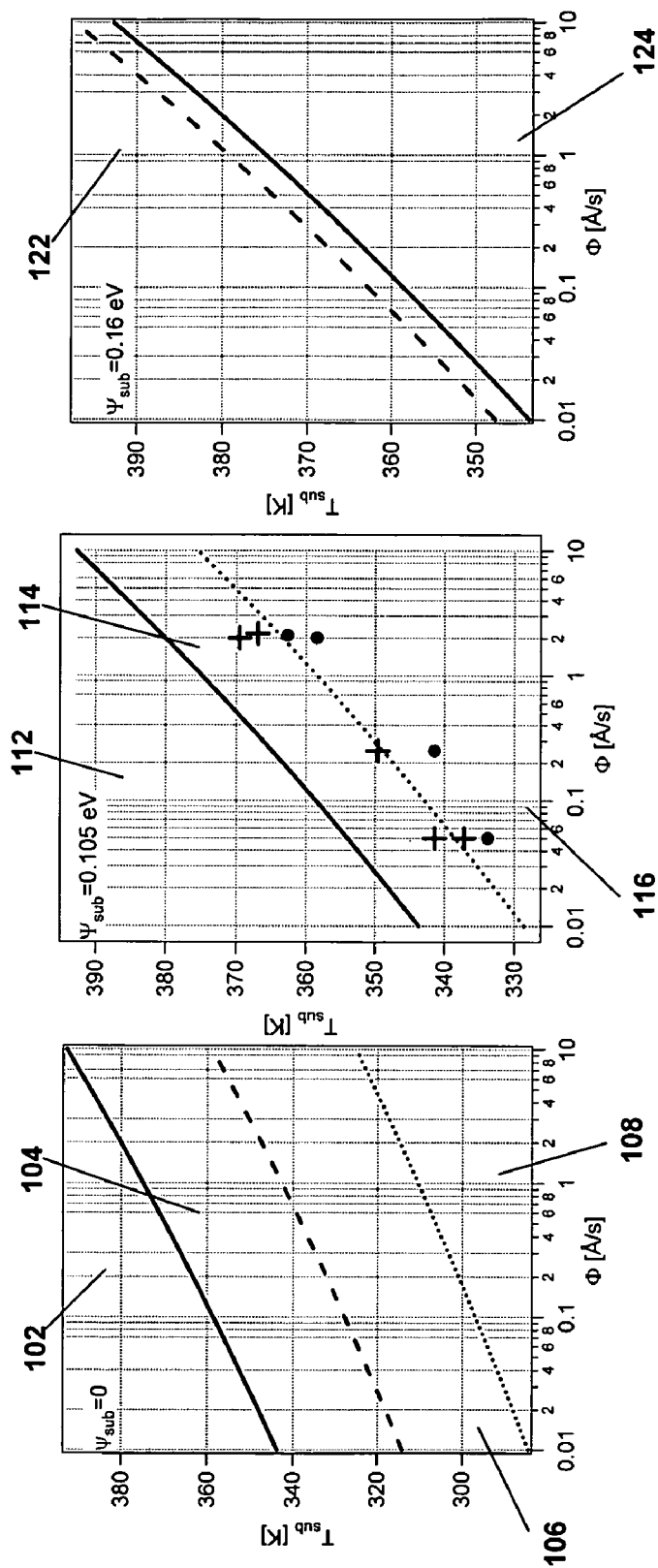
FIG. 1a is an illustration of the nucleation regions of a pentacene film on a virtual substrate that induces no interaction with the film, as illustration of specific deposition parameters as can be used in embodiments of the present invention.
FIG. 1b is an illustration of the nucleation regions of a pentacene film on a UV-ozone treated $SiO_2$ surface illustrating specific deposition parameters as can be used in embodiments of the present invention.
FIG. 1c is an illustration of the nucleation regions of a pentacene film on a virtual substrate that induces molecule-substrate interactions that are stronger than the interlayer pentacene-pentacene interactions, illustrating specific deposition parameters as can be used in a first embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third, and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," as used in the claims, should not be interpreted as being restricted to the means listed thereafter: the term does not exclude other elements or steps. Thus, the scope of the expression "a device comprising means A and B" should not be limited to devices consisting only of components A and B. The term means that with respect to the present invention, the only relevant components of the device are A and B.

The present invention is concerned with the spatial and temporal modulation of thin film growth during production of thin films. Most polycrystalline and crystalline films nucleate and grow according to physical principles described by the atomistic theory of growth. When particles, such as atoms or molecules, are deposited on a substrate, those particles aggregate and form a nucleus. Small nuclei are unstable because of their surface energy, and become increasingly unstable by addition of individual particles, such as atoms or molecules, until a critical size is reached.

Beyond this critical size, the nucleus has gained enough 'mass' to stabilise additional particles, such as atoms or molecules, without increasing its surface energy too much. While growing further, the nucleus will become less unstable and will finally become stable. In other words, to form a stable nucleus, an energy barrier associated with the energy required to form a critical nucleus needs to be overcome, whereby the critical nucleus is the smallest nucleus possible (i.e., with the least number of molecules) that will become energetically less unstable by adding one other particle.

The energy of formation $\Delta G^*$ of a critical nucleus with the thermodynamically most stable shape is given by:

$$\Delta G^*_{3D} = \frac{(\psi_{ijk,s} + \psi_s)g(\psi_{ijk})}{\Delta \mu^2} \quad [1]$$

Here, $\psi_{ijk}$ is the surface energy per unit cell of surface (ijk), which has been calculated by Kosbar et al. in MRS Symp. Proc. 665 (2001) 401, $\psi_s$ is the contribution to the surface energy for the interface nucleus-substrate, $\psi_{ijk,s}$ is the surface energy of the surface that has grown parallel to the substrate surface, and $\Delta\mu$ is the supersaturation.

The supersaturation is defined as the difference in chemical potential between a particle (e.g., an atom or molecule) in vapor, solution, and/or in any ambient, and a particle (e.g., an atom or molecule) in a bulk crystal. In other words, the energy the system loses during energy minimization by transferring a particle (e.g., an atom or molecule) from vapor, solution, and/or from presence in an ambient to an infinite crystal.

This supersaturation depends on the growth or deposition conditions. The growth or deposition conditions are a set of deposition parameters giving a complete or as complete as possible description of the growth of a deposit. A deposition parameter may be any physical quantity that affects any physical property of a deposit during deposition. These parameters can be substrate temperature $T_{sub}$ and deposition flux $\Phi$ when deposited from vapor, or substrate temperature $T_{sub}$ and concentration when deposited from solution. If the film is grown from other ambients, other parameters might be relevant as well, such as stoichiometry of the ambient.

For the growth from vapor, such as by sublimation or evaporation of an organic material in vacuum, the supersaturation can be expressed as $$\Delta\mu \approx RT_{sub}\ln\left(\frac{\sqrt{2\pi MRT_{sub}}}{P_\infty(T_{sub})}\Phi\right) \quad [2]$$

where R is the universal gas constant,

M the molecular weight of the particle, and $P_\infty(T_{sub})$ the equilibrium standard vapor pressure of the material at temperature $T_{sub}$.

M and $P_\infty(T_{sub})$ are nucleus material dependent parameters. It will be clear that the higher the supersaturation (i.e., the more energy the system loses during energy minimization by incorporating a particle into the nucleus), the fewer particles are required to form a critical nucleus.

At sufficiently high supersaturation, the critical nucleus has become so small, that the thermodynamically most stable shape would require the nucleus to be less than one mono-layer high, which is physically impossible. At those supersaturations, the height of the nucleus is pinned to one mono-layer, while the other surfaces are still free to take the energetically most stable shape. A nucleus that is exactly one mono-layer high is called a two-dimensional (2D) nucleus and will lead to 2D nucleation. The energy required to form a critical 2D nucleus is given by:

$$\Delta G^*_{2D} = \frac{g(\psi_{ijk})}{2\Delta\mu - (\psi_{ijk,s} + \psi_s)} \quad [3]$$

The supersaturation at which 2D nucleation becomes possible, but is not necessarily the most stable, is called the critical supersaturation $\Delta\mu_{cr}$:

$$\Delta\mu_{cr} = \frac{\psi_{ijk,s} + \psi_s}{2} = \psi_c - \psi_{sub} \quad [4]$$

with $\psi_{sub}$ the interaction energy, also referred to as interaction between a particle (e.g., an atom or molecule) and the substrate, and $\psi_c$ the interaction between neighboring particles or the interaction energy between a particle and a particle layer. The supersaturation at which the most stable and physically possible critical nucleus becomes 2D, is called the transition supersaturation $\Delta\mu_{tr}$:

$$\Delta\mu_{tr} = \psi_{ijk,s} + \psi_s = 2\psi_c - 2\psi_{sub} \quad [5]$$

While $\psi_c$ is a parameter depending on the nucleus material, $\psi_{sub}$ depends on the combination of nucleus material and substrate material.

Several possibilities can now be considered. If $\psi_{sub} < \psi_c$, there is a transition from no or substantially no nucleation (no growth) to 3D nucleation at $\Delta\mu=0$. Moreover, if $\psi_{sub} < \psi_c$ there is a transition from 3D nucleation to 2D nucleation at $\Delta\mu=\Delta\mu_{tr}$. On the other hand, if $\psi_{sub} \geq \psi_c$, there is a transition from no or substantially no nucleation, (i.e., where no growth or substantially no growth occurs) to 2D nucleation at $\Delta\mu=\Delta\mu_{cr}$. In this case, 3D nucleation is thermodynamically not possible.

The various growth condition windows (i.e., the group of suitable growth conditions) for no or substantially no nucleation, 2D, and 3D nucleation are indicated in graphs showing the deposition flux $\Phi$ on the abscissa and the substrate temperature $T_{sub}$ on the ordinate of FIGS. 1a, 1b, and 1c for the example of a pentacene thin film on a substrate.

In FIG. 1a, an example of different nucleation regions of the pentacene film on a virtual substrate that induces no interactions with the film is shown. In this case, the molecule-substrate interaction $\psi_{sub}$ equals 0 eV. Region 102, which is the region above the solid line, indicates all growth conditions, in this example determined by the substrate temperature $T_{sub}$ and the deposition flux $\Phi$, for which no or substantially no nucleation is possible. Region 104, which is the region in between the solid and the dashed line, indicates the growth conditions for which only 3D nucleation is possible.

Region 106, which is the region in between the dashed line and the dotted line, indicates the growth conditions for which 2D nucleation is almost impossible, and thus a lot less likely event than 3D nucleation. The probability for 2D nucleation decreases very rapidly for increasing temperature above the dotted line and 2D nucleation is therefore negligible in this region. In region 108, which is below the dotted line which indicates the growth conditions at transition supersaturation $\Delta\mu_{tr}$, growth conditions are indicated for which substantially only 2D nucleation will occur. In this case 3D nucleation is substantially impossible.

In FIG. 1*b*, nucleation regions are indicated on the $T_{sub}$–$\Phi$ graph for a pentacene film on a UV-ozone treated $SiO_2$ surface. The transition supersaturation is fitted to the experimentally determined cross-over from 3D nucleation to 2D nucleation, using $\psi_{sub}$=0.105 eV. The experimental results for 3D nucleation are indicated using crosses, while the experimental results for 2D nucleation are indicated using circles.

Region 112, which is the region above the solid line, indicates growth conditions for which no or substantially no nucleation occurs. Region 114, which is the region between the solid line and the dotted line, indicates growth conditions for which only 3D nucleation occurs. Region 116, which is the region below the dotted line, indicates growth conditions for which substantially only 2D nucleation occurs.

In FIG. 1*c*, nucleation regions are indicated on the $T_{sub}$–$\Phi$ graph for a pentacene film on a virtual substrate that induces particle-substrate interactions that are stronger than the interlayer or inter-particle pentacene-pentacene interactions ($\psi_{sub}$=0.16 eV). For this example, there is substantially only one transition from a region 122 to a region 124. The region 122 is above the critical supersaturation dashed line, indicating growth conditions for which no or substantially no nucleation occurs. The region 124 is below the critical supersaturation dashed line, indicating growth conditions for which 2D nucleation occurs. The above example indicates that depending on the growth conditions and both the treated substrate material and thin film material used, either no or substantially no nucleation, 2D nucleation, and/or 3D nucleation can be obtained.

Besides selection of the type of nucleation, also selection of the grain size and distribution can be obtained. By varying the supersaturation $\Delta\mu$, the energies to form 3D or 2D nuclei are modulated. Since those energies are actually energy barriers against nucleation, a variation of $\Delta\mu$ results in a variation in nucleation rate J, and therefore in a variation in grain size and distribution.

$$J \sim \exp\left(\frac{\Delta G^*}{RT_{sub}}\right) \qquad [6]$$

It is worth noting that 3D nucleated grains will continue to grow in a 3D fashion, at least until the grains percolate, i.e., until the grains start to form a web and cannot be seen as islands anymore. After the grains have percolated, it is possible that 2D grains will nucleate on top of this layer of percolated 3D grains. Depending on the growth conditions, the nucleation rate can be so low that 3D grains will not percolate in practical situations.

Three-dimensional (3D) nuclei form bulky, isolated grains which tend to form at least ill-connected films, mostly not connected at all. The more the supersaturation is below the transition supersaturation, the less 3D grains will nucleate and the less they can be connected. The shorter the time the film is given to nucleate, the less 3D grains will nucleate and/or the less those 3D nuclei can grow, and therefore the less they can be connected. Two-dimensional (2D) nuclei, i.e., nuclei that are one mono-layer high, on the other hand will easily 'wet' the substrate and form well-connected films.

The current invention comprises methods for the production of a patterned film by modulating the nucleation mode of the materials that will form the film. The nucleation mode can be 2D nucleation, 3D nucleation, or no or substantially no nucleation. As explained above, the nucleation mode is determined by the nucleus material, the growth conditions and the surface status of the substrate. The nucleation mode can be modulated by modulating one or more of these determining aspects. Furthermore, the invention is not restricted to the use of a single thin film material during patterning.

In a first embodiment of the present invention, a method for growth of patterned thin films and thin films thus obtained are described, whereby modulation of the substrate surface interaction is performed across the substrate surface, in combination with one thin film material that allows for 3D nucleation, 2D nucleation, or no or substantially no nucleation at a set of growth conditions that are experimentally easily accessible. Spatial modulation of the nucleation type during growth can then be obtained by selecting different substrate-particle interactions over different regions (i.e., different parts or subsets) of the substrate surface area. The substrate surface thereby is the outer surface of the substrate onto which it is intended to create the patterned thin film. The method thus comprises adjustment of the substrate surface in specific regions to induce different interactions with the thin film to be deposited.

Obtaining a different surface-particle interaction by adjusting the surface and/or surface properties may be performed by applying a surface treatment, such as partially covering the surface with a layer, partially etching the surface, and partially processing a substrate. Surface treatments include, but are not limited to, spin-coating solution processable materials, deposition of self-assembled mono-layers from solution or from vapor, treatments in plasma or reactive gasses, deposition of materials by various means such as sublimation, evaporation, plasma-polymerisation, an appropriate substrate selection, and so on.

This wide range of surface treatments in turn allows for a wide range of patterning techniques, including but not limited to: printing techniques, such as screen printing, offset printing, inkjet printing, solid ink printing; stamping techniques, such as micro-contactprinting, embossing, nano-imprint lithography, micro-cutting; molding techniques, such as micro-molding in capillaries; masking techniques, such as shadow masking, photolithography, or other lithographic means; and coating the entire substrate with a layer and selectively remove part of the layer via selective etching, selective processing, and so on. Those parts of the surface which are not treated by a first surface treatment can optionally be treated by another surface treatment.

Alternatively, the substrate may comprise different parts, or sub-substrates, each comprising different materials and joined together. The substrate also may have a non-flat topology. Thus the surface treatment can correspond to a choice of substrate, or a choice of part substrates or sub-substrates. The part substrates or sub-substrates may comprise different substrate materials, such as different semiconductor materials having different structural and/or functional characteristics joined together.

An appropriate choice of surface treatments and patterning techniques allows for patterning the substrate surface prior to growth, without risk of degrading the semiconductor material, in a low-cost way, flexible in circuit design, such as when choosing printing techniques, with high dimensional and alignment resolution and at high speed. Depending on the chosen patterning technique, a dimensional resolution of less than 10 nm can be achieved by those skilled in the art. The later resolution can be achieved by using imprint lithography.

The substrate may be any material in a condensed state. Some non-limiting examples include an organic semiconductor material, a metal, a dielectric material, an electrically isolating material, a glass, a polyester, a transparent conductive oxide, and a semiconductor device, which can be any device or intermediate device produced by semiconductor processing as for instance, but not limited to, a solar cell, a MEMS device, a memory device, a sensor device, and so on.

If covering the substrate with a layer is used to adjust the surface-particle interaction, the layer used may be any suitable layer that provides a distinct substrate-particle interaction. The present invention is not limited by the way how the surface is adjusted, nor by the way of selecting parts of the surface which are adjusted. By selecting the specific surface properties used in the different areas of the substrate and by selecting an appropriate window of the growth conditions, patterning of a thin film can be obtained, as a first nucleation type can be obtained on a first area of the substrate while a second nucleation type can be obtained on a second area of the substrate. In other words, the interaction between the film and the substrate is patterned, or modulated spatially over the surface of the substrate.

The substrate materials used can be any type of materials as long as their surface properties allow for performing the modulated deposition method. It is an advantage of the present invention to pattern the substrate such that the difference in substrate-particle interaction between each treated substrate surface part and the particle is maximal. The latter allows for obtaining a maximum window of growth conditions that allows for different nucleation on each surface part.

Patterning of thin films can in principle be done for every type of thin film to be grown as long as the interaction between the thin film material and the substrate combined with the growth conditions allows different types of nucleation, i.e., at least two of: 2D nucleation, 3D nucleation, and no or substantially no nucleation. The method can be applied to any material, such as metals, semiconductors including organic semiconductors, and any type of organic material.

Crystalline covalently bonded solids require epitaxial surfaces with matching or nearly matching lattice constants. The concept of patterning the substrate surface in regions where 2D and 3D nucleation occur is applicable to these solids, although the ability for engineering the surface is somewhat restricted due to the high requirements on lattice constants for the growth of these crystalline solids.

Materials that are well suited for patterning are polycrystalline and crystalline films of Van der Waals bonded solids as they have relatively weak interactions with the substrate and as their ability to form crystalline or polycrystalline films depends rather on the strength of their intra-solid interactions. For these films, there are no strong requirements for epitaxial growth. An example of such Van der Waals bonded solids are small molecule organic semiconductors that form polycrystalline or crystalline films, even on top of an amorphous substrate. These small organic molecules are defined as those well defined molecules that allow formation of a well organized, crystalline layer.

For the growth of these organic semiconductors, substrate temperatures below 200° C., and often below 100° C., can be used. The relative low substrate temperature allows for a wide range of surface treatments, which may be used without the surface treatments being degraded during subsequent growth of the thin film, i.e., without degradation due to high substrate temperatures.

The higher performance of small molecule organic semiconductors can be combined with the lower processing cost of solution-processable semiconductors. The present technique therefore more advantageously can be used for organic materials, such as organic semiconductors and organic layers, based on small molecules.

The method is not limited to growth of a single thin film on a substrate but may also be used to pattern a thin film comprised in an electronic device, such as a semiconductor device like a transistor or an organic transistor. In other words, the thin film does not have to be grown on a bare substrate.

In prior art documents, surface treatments were applied in order to intentionally vary the surface energy or hydrophobicity. The surface energy is defined as half the energy per unit area required to create two surfaces by splitting an infinitely large volume of substrate material. The surface energy depends on substrate material properties and is independent of the film grown on top of the substrate surface. Hydrophobicity, on the other hand, depends on the interfacial properties of the interface between the substrate and a drop of water, and again lacks information about the film.

The effect of surface treatments on morphology as seen in prior art documents, concerned grain size and shape, i.e., dendritic or compact, but remained an effect in the 2D growth regime. Modulating of the molecule-substrate interaction $\psi_{sub}$, as is done in the present application, contains all information about the substrate-film interface required for describing the energy to nucleate a film on the substrate surface. According to the present invention the interaction energy $\psi_{sub}$ is varied intentionally such that nucleation can be modulated, with focus on the transitions between 2D and 3D nucleation; 2D nucleation and no or substantially no nucleation; and 3D nucleation and no or substantially no nucleation. In the following, different examples of this embodiment will be given, by way of illustration.

In a first example, together with an appropriate window of growth conditions, the surface of the substrate is chosen such that a first part of the film has a favorable interaction for 2D nucleation of the film, and a second part has a less favorable interaction for 2D nucleation of the film. In the second part, 3D nucleation or no or substantially no nucleation will occur. It will be obvious that the first part and the second part can each also be a group of parts of the surface.

An illustration of a film showing 2D growth in certain regions while showing no growth or substantially no growth or 3D growth in other regions is given for a pentacene film grown on a $SiO_2$ substrate surface that is patterned in regions treated with OctadecylTrichlorosilane (further referred to as OTS) on the one hand, and regions treated with perfluorodecyltrichlorosilane (further referred to as FDTS) on the other hand. Whereas the example is shown for surface treatment based on silanes, other examples can include the use of polystyrene or poly(vinyl phenol) to induce an interaction energy $\psi_{sub}$ of approximately 0.12 eV or higher.

Figure 2A:
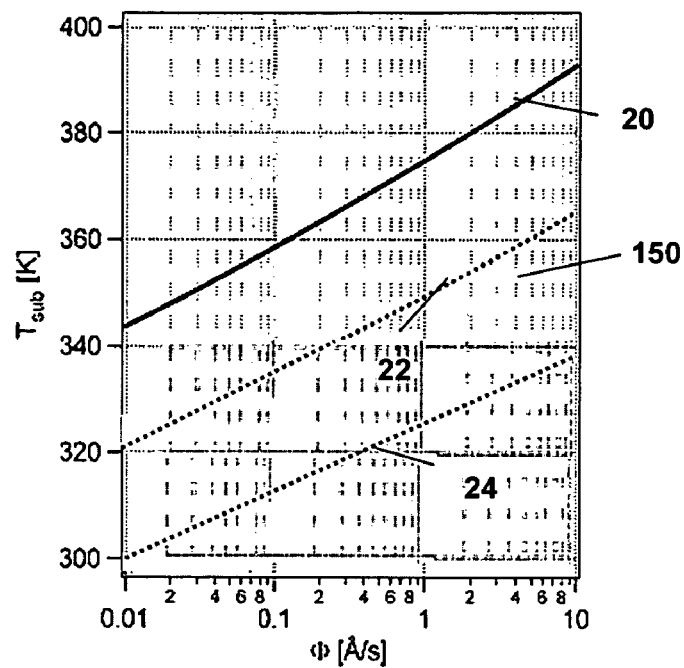
FIG. 2a is an illustration of the deposition parameters on different nucleation regions of a pentacene film on a substrate surface which is partly covered with OctadecylTrichlorosilane (further referred to as OTS), and partly covered with perfluorodecyltrichlorosilane (further referred to as FDTS), as can be used in the first embodiment of the present invention.

The different nucleation behavior for pentacene on the different regions of such a substrate is shown for different growth conditions in FIG. 2a. The solid line 20 indicates zero supersaturation, i.e., pentacene does not nucleate for growth conditions in the region above this solid line 20. The upper dotted line 22 is the transition supersaturation for pentacene growth on OTS. At growth conditions below this dotted line 22, pentacene will nucleate 2D on the OTS-treated surface. The lower dotted line 24 is the transition supersaturation for pentacene growth on the FDTS-treated surface. At growth conditions above this lowest dotted line 24, pentacene will nucleate 3D on the FDTS-treated surface. The more above this lowest dotted line the growth conditions are situated, the lower the nucleation rate will be and thus the less 3D grains are present. The amount of 3D grains can even be negligible. Between the two dotted lines, a region 150 occurs in the $T_{sub}$-Φ graph of FIG. 2a, defining growth conditions whereby pentacene nucleates 3D on FDTS-treated surfaces and nucleates 2D on OTS-treated surfaces.

In Table 1, by way of example, some more chemicals and their effect if used for surface treatments are listed with their corresponding interaction energy $\psi_{sub}$ for pentacene deposition. Any combination of surface treatments with different interaction energy $\psi_{sub}$ allows for patterned growth, yet combining different surface treatments will affect the window of growth conditions for patterned growth of pentacene on a patterned surface.

saturation $\Delta\mu_{tr}$=0.082 eV, i.e., for pentacene-CTS (11-Cyanoundecyl trichlorosilane) treated surfaces. The dotted line 34 illustrates the ratio for transition supersaturation $\Delta\mu_{tr}$=0.091 eV, i.e., for pentacene-UTS (10-Undecenyl trichlorosilane) treated surfaces. The dashed line 36 illustrates the ratio for transition supersaturation $\Delta\mu_{tr}$=0.097 eV, i.e., pentacene-OTS (Octadecyl Trichlorosilane), pentacene-BTS (11-Bromoundecyl trichlorosilane) or pentacene-UV-ozone-treated surfaces.

Figure 2B:
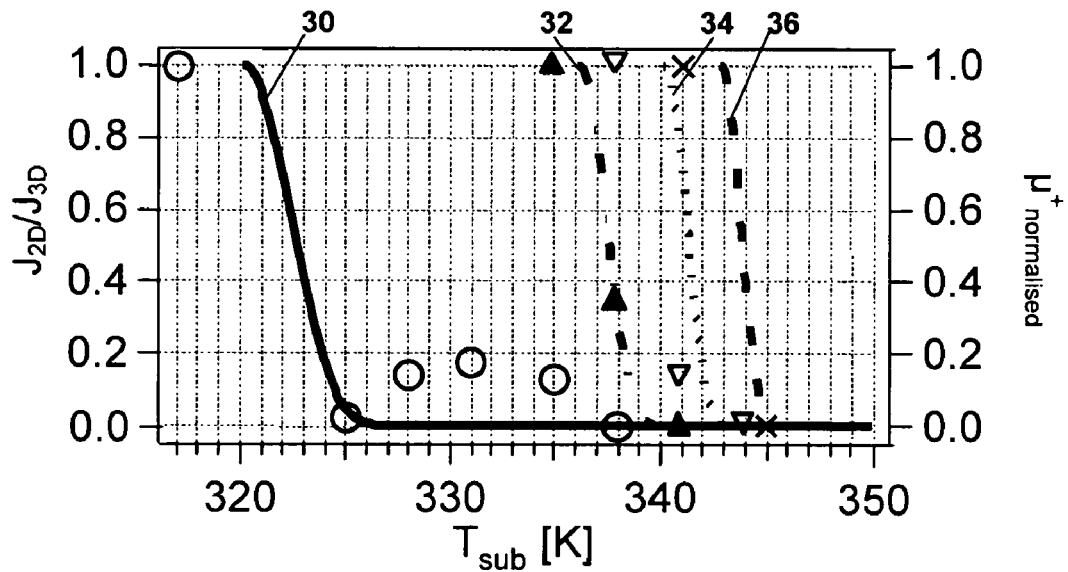
FIG. 2b is a graph that indicates the conductivity as a function of substrate temperature for deposition of pentacene on a substrate surface treated in different ways, according to the first embodiment of the present invention.

The experimental results shown in FIG. 2b illustrate a corresponding drop of mobility with decreased portion of 2D nucleation compared to 3D nucleation, demonstrating that film properties, in this case charge carrier mobility, can be patterned by varying the film morphology. The experimental points represent the normalized mobilities shown in Table 1, whereby the O are for pentacene transistors grown on FDTS-treated SiO$_2$ substrates, ▲ for pentacene transistors grown on CTS-treated SiO$_2$ substrates, Δ are for pentacene transistors grown on UTS-treated SiO$_2$ substrates, and x are for pentacene transistors grown on OTS-treated surfaces.

In case of FDTS, $\Delta\mu_{2D\text{-}3D}$ is high enough such that the 3D nucleation rate, even at supersaturation smaller than the transition supersaturation, $\Delta\mu < \Delta\mu_{tr}$, is still high enough to form a percolated charge transport path between formed 3D grains.

TABLE 1

| Surface chemistry | Water Contact Angle [°] | $T_{sub,2D\text{-}3D}$ [K] at Φ = 0.25 ± 0.03 Å/s | $\Delta\mu_{2D\text{-}3D}$ [eV] | $\mu^+$ ($T_{sub}$) [cm$^2$/Vs, K] |
|---|---|---|---|---|
| Octadecyl Trichlorosilane (OTS) | 109 ± 1 | 343 ± 3 | 0.097 | 0.6 (341) <br> 0 (345) |
| 11-Bromoundecyl trichlorosilane (BUTS) | 90 ± 3 | 343 ± 3 | 0.097 | 0.2 (341) <br> 0 (345) |
| 10-Undecenyl trichlorosilane (UETS) | 95 ± 2 | 340 ± 3 | 0.091 | 0.6 (338) <br> 0.08 (341) <br> 0 (345) |
| 11-Cyanoundecyl trichlorosilane (CUTS) | 80 ± 1 | 336 ± 3 | 0.082 | 0.2 (335) <br> 0.07 (338) <br> 0 (341) |
| Heptadecafluoro-1,1,2,2-tetrahydrodecyl) Trichlorosilane (FDTS) | 111 ± 1 | 320 ± 3 | 0.046 | 0.4 (316) <br> 0.008 (325) <br> 0 (341) |
| UV-ozone | <10 | 343 ± 3 | 0.097 | 0.1 (331) <br> 0.07 (338) <br> 0 (341) |

The transition supersaturation $\Delta\mu_{tr}$ is calculated for different surface treatments from the experimentally determined substrate temperature $T_{sub}$ at which the morphology of the pentacene film changes from 2D nucleation to 3D nucleation, while the deposition rate Φ is kept constant at 0.25 Å/s. The results are shown in Table 1, showing the surface chemistry, the water contact angle, the substrate transition temperature, and some room temperature hole mobilities $\mu^+$ in pentacene films, which were grown at a substrate temperature close to the transition temperature. It is clear that the water contact angle cannot be used as a criterion to select surface treatments for patterned growth, since there is no systematic relation between the water contact angle and the transition supersaturation $\Delta\mu_{tr}$.

FIG. 2b shows the calculated ratio (lines) and the experimental data (symbols) of 2D to 3D nucleation rates $J_{2D}/J_{3D}$ as a function of the substrate temperature $T_{sub}$ for deposition of pentacene on treated SiO$_2$ surfaces. The full line 30 illustrates this ratio for surface treatments for transition supersaturation $\Delta\mu_{tr}$=0.046 eV, i.e., for pentacene-FDTS (Heptadecafluoro-1,1,2,2-tetrahydrodecylTrichlorosilane) treated surfaces. The dash-dotted line 32 illustrates the ratio for transition super- Therefore, in the case of patterned growth on OTS/FDTS treated surfaces, it is advantageous to select growth conditions that have a supersaturation Δμ as low as possible, though still allowing for 2D nucleation on OTS. The film will then be connected or continuous in the 2D nucleated region and disconnected or non-continuous in the regions of 3D nucleation, or not have nucleated at all.

For the given example of a perfluorodecyltrichlorosilane treated part of the surface, non-continuous 3D growth will occur. Only the 2D nucleated region can properly conduct current, and this invention can therefore be used to produce thin films with patterned connectivity and thus conductivity. The difference in charge-carrier mobility can be used, but not limited thereto, to pattern active area of electronic devices, as for instance, but not only, TFTs. In that case, the surface is patterned such that pentacene nucleates 2D in the transistor active area, while it nucleates 3D, preferably with a low nucleation density, outside the transistor active area. This can be done by treating the surface of the active area with OTS, while all other areas are treated with FDTS.

In other words, in the present example, proper choice of the surface treatments to pattern the interaction between film and substrate, and proper choice of the growth conditions at which the film is grown, allows the film to nucleate 2D on a first part of the substrate (i.e., if the condition $\psi_{sub,1}<\psi_{sub,2}$ is fulfilled) and to nucleate 3D on a second part of the substrate (i.e., if the condition $\psi_{sub,1}<\psi_c$ is fulfilled). Moreover, by a careful choice of the surface treatments, the growth window in which part will nucleate 2D and the other part will nucleate 3D can be maximized. The condition to be fulfilled then is obtaining a maximum difference in interaction between the particle and the substrate surface in the first part of the substrate and interaction between the particle and the substrate surface in the second part of the substrate $|\psi_{sub,2}-\psi_{sub,1}|$. Thus, in the current example, a way of engineering the interaction energy $\psi_{sub}$ is illustrated based on choosing a layer that can be coated on top of the substrate surface.

In a second example, a proper choice is made of the surface treatments of the substrate to pattern the interaction between film and substrate, together with a proper choice of the growth conditions, such that the film will nucleate in 2D topology on a first part of the substrate, and will not or substantially will not nucleate at a second part of the substrate. Again, a careful selection of the specific surface treatment used can allow to maximize the window of growth parameters for which the material will nucleate in 2D topology on the first part of the substrate and not or substantially not nucleate on the second part of the substrate.

This requires the choice or engineering of an appropriate substrate surface such that the interaction of the particle with the substrate is larger than the interaction between neighboring particles (i.e., $\psi_{sub,1}>\psi_c$, for the first part of the substrate surface) and the interaction of the particle with the second part of the substrate is smaller than the interaction of the particle with the first part of the substrate (i.e., $\psi_{sub,2}<\psi_{sub,1}$ for the second part of the substrate surface). To maximize the window of growth conditions in which the material will nucleate in 2D topology on the first part and not on the second part of the substrate, both the differences in interaction of a particle with the two parts of the substrate (i.e., $|\psi_{sub,1}-\psi_{sub,2}|$) and the difference between the interaction of a particle with the first part of the substrate and with a neighboring particle (i.e., $|\psi_{sub,1}-\psi_c|$) need to be maximized.

In a third example of the present embodiment of the invention, a proper choice of the surface treatments to pattern the interaction between the film and the substrate is made, such that the material will nucleate in 3D topology on a first part of the substrate, and will nucleate substantially less at a second part of the substrate. Moreover, the window of growth conditions in which part of the film will grow in 3D topology and in which the other part of the film will have substantially less nucleation, can be maximized.

This can be obtained by choosing the interaction between the first part of the substrate and the particle smaller than the interaction between neighboring particles (i.e., $\psi_{sub,1}<\psi_c$) for the first part of the substrate where the film will nucleate in 3D topology, and by choosing the interaction between the particle and the first part of the substrate larger than the interaction between the particle and the second part of the substrate (i.e., $\psi_{sub,2}<\psi_{sub,1}$) for the second part of the substrate where the film will nucleate substantially less. To maximize the window of growth conditions, the difference between the interaction of a particle with the first part of the substrate and with the second part of the substrate $|\psi_{sub,2}-\psi_{sub,1}|$ should be maximal.

By performing the method of the present example, the energy of formation of the 3D nucleus is modulated. The energy of formation of a nucleus is an energy barrier against nucleation, and the nucleation rate depends exponentially on this barrier. By changing the interaction energy $\psi_{sub}$ between a particle and the substrate, this barrier can be modulated, as shown in equation [1].

Other embodiments making use of the no or substantially no nucleation to 2D nucleation transition, or 3D to 2D nucleation transition, are based on a thermodynamic possibility.

The previous examples were oriented to the specific growth conditions selected for the modulated spatial surface treatment. The following examples illustrate the application of the patterning technique of the present invention for the specific example of organic thin film transistors.

In a fourth example, the specific application of the present embodiment for organic thin film transistors is described. For organic TFTs, organic semiconductors that allow for good charge transport in the crystal plane parallel to the gate, are preferred. Preferably small molecule organic semiconductors which crystallize in a herringbone or sandwich herringbone packing are used, because they grow in molecular layers parallel to the gate, and intra-layer charge transport is most beneficial in those types of semiconductors. Examples of those kind of semiconductors include pentacene, tetracene, perylene, terrylene, quaterrylene, oligothiophenes like quaterthiophene, sexithiophene, and molecules derived thereof. For those molecules, the transition supersaturation $\Delta\mu_{tr}$ is determined by $$\Delta\mu_{tr}=2(\psi_c-\psi_{sub}),$$

where $\psi_c$ is the interlayer interaction between one molecule and a neighboring molecular layer, and $\psi_{sub}$ is the interaction between one molecule and the substrate.

While $\psi_c$ is a property of the molecular crystal, $\psi_{sub}$ can be tuned by engineering the substrate surface. As an example, FIG. 3 gives an indication of the substrate-molecule interaction energy $\psi_{sub}$ for pentacene on $SiO_2$ treated by various surface treatments: no treatment (indicated by +), silanization of a $SiO_2$ surface by perfluorodecyltrichlorosilane (indicated by ■), octadecyltrichlorosilane (OTS) (indicated by □), and treatment of the $SiO_2$ by UV-ozone (indicated by o) or alternatively in an oxygen plasma.

In general silanization of an oxide surface, using any kind of silane of which the end-group is modified to engineer the substrate-molecule interaction energy $\psi_{sub}$ and whereby any kind of oxide surface can be used, in particular here those that can also be used as gate dielectric, like $Al_2O_3$ and $Ta_2O_5$, or thiolization of a metal surface, using any kind of thiol of which the end-group is modified, is a useful tool to change the surface treatment. Patterning of the silanes or thiols can conveniently occur by micro-contactprinting, as known by those skilled in the art.

Figure 3:
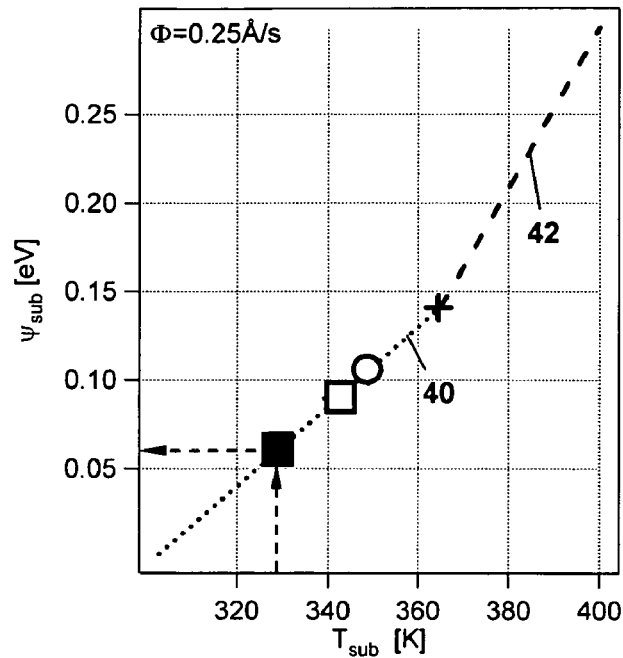
FIG. 3 is a graph of the substrate-particle interaction $\psi_{sub}$ as a function of the substrate temperature, for pentacene on $SiO_2$ treated by various surface treatments as can be used in the first embodiment of the present invention.

For a constant flux, the pentacene-molecule interaction $\psi_{sub}$ can be calculated from the experimentally determined substrate temperature at which the transition from 2D to 3D nucleation occurs, indicated with the dotted line 40 in FIG. 3. If the substrate-molecule interaction $\psi_{sub}$ is larger than the interlayer interaction $\psi_c$ between one molecule and a neighboring molecular layer, the transition from 2D nucleation to no or substantially no nucleation can be used to extract $\psi_{sub}$, indicated with the dashed line 42 in FIG. 3. For patterning the growth into 2D nucleating and 3D nucleating regions, preferably two surface treatments are chosen such that $\Delta\psi_{sub}$ is maximal.

More examples of materials that can be used for surface treatments to obtain different nucleation during growth are chlorosilanes, alkoxysilanes, fatty acids, thiols, and phosphates. It will be clear that, although the use of specific chemicals is described in the different examples, the invention is not limited thereto.

In a second embodiment of the present invention, the method used for patterning thin films is based on a modulation of the thin film materials used to grow the film, in combination with a selection of the appropriate growth conditions to form the film. Furthermore, combination with the selection of an appropriate surface treatment or pattern of surface treatments of the substrate also is possible.

The surface treatment(s) and the substrate material(s) that can be used in the present embodiment are substantially identical and have similar features as those described and listed in the previous embodiment and its examples. In this second embodiment, an appropriate selection of two or more materials is required. The materials from which the selection is made have different nucleation behavior such that 2D nucleation, 3D nucleation, and/or no or substantially no nucleation can be obtained.

The selection of the materials may be based on the following criteria. Materials with a high vapor pressure have a small window of growth conditions at which the material will nucleate, typically at high deposition fluxes and low substrate temperatures. Outside this window, substantially no or no nucleation occurs. Materials with a large particle-particle interaction $\psi_c$, will nucleate in 3D topology in a large window of growth conditions and for many surface treatments. The presence of a large window of growth conditions can be explained by the fact that a large particle-particle interaction $\psi_c$ also requires a larger particle-substrate interaction $\psi_{sub}$ if a small transition supersaturation $\Delta\mu_{tr}$ is to be obtained, and by the fact that obtaining a larger particle-substrate interaction $\psi_{sub}$ is difficult due to the difficulty to find corresponding substrate surface treatments.

Therefore, one often has to settle with a larger transition supersaturation $\Delta\mu_{tr}$ in comparison with another material that has a small particle-particle interaction $\psi_c$ and thus, with a larger window of growth conditions for 3D nucleation. These materials thus are suitable if 3D nucleation is to be obtained. The material to be nucleated in 3D topology can be any material chosen to have a large transition supersaturation $\Delta\mu_{tr}$, such as perylene, perylene derivatives, and an organic molecule that packs in the γ or β crystal structure (i.e., a molecule that packs very densely in one dimension to form columns). Films of those molecules can nucleate in 3D topology with the columns standing substantially perpendicular to the substrate. Some examples of these types of materials include phthalocyanines, coronene, Alq$_3$, and derivatives thereof.

Furthermore, materials with a small particle-particle interaction $\psi_c$ and a low vapor pressure generally have a large and easily accessible window of growth conditions to nucleate in 2D topology. These materials include pentacene, terrylene, quaterrylene, oligothiophenes, and derivatives thereof.

It is possible in this way to produce a patterned film, in which the film properties are patterned by making use of the difference in material or morphological properties of the first and second material. In addition, the difference in material or morphological properties can induce a specific interface property at the patterned interface between the first and second material. The method according to the present embodiment will be illustrated by way of different examples. It will be obvious for the person skilled in the art that the examples are only given by way of illustration and that they do not limit the features of the present embodiment.

As a first example of the second embodiment of the present invention, the growth of a first and second material having a different nucleation behavior is described. A first material nucleating in 3D topology is grown on the substrate surface using a first set of growth conditions. This material can be grown at growth conditions such that the 3D nuclei form isolated (i.e., island-like or not connected, randomly distributed, 3D grains). These growth conditions typically are determined by a set of properties consisting of the substrate temperature, the deposition flux, and the duration of deposition. The duration of deposition does not influence the nucleation mode, but can influence the density of nuclei that are formed at the substrate surface, the size of the grains that are grown out of those nuclei, and the thickness of the film.

Next, a second material can be grown at the same substrate surface which is now partly covered by randomly distributed ill- or not-connected 3D grains, at a second set of growth conditions. This second material and the second set of growth conditions are chosen such that the second material will nucleate in 2D topology at the parts of the substrate surface that are not yet covered by the first material. The 2D nucleated film can be grown such that it completely wets the parts of the substrate surface that was not yet covered by the first material and thus connects well to the 3D nucleated grains of the first material, and will as such form an interface with the 3D nucleated grains of the first material. This way, a patterned film is produced, in which the film properties are patterned by making use of the difference in material properties of the first and second material, and in which the pattern is randomly distributed.

Figure 4:
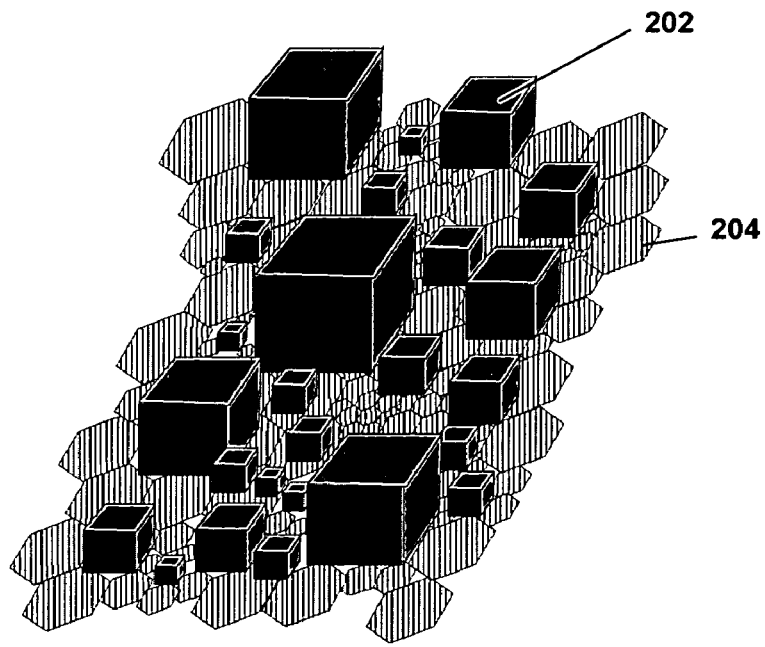
FIG. 4 is an illustration of a patterned thin film indicating 3D growth alternated with 2D growth as can be obtained using a second embodiment of the present invention.

This is illustrated in FIG. 4, which depicts a first material grown at a first set of growth conditions to nucleate 3D grains 202 that do not fully cover the substrate and a second material grown at a second set of growth conditions to nucleate 2D grains 204 that fully wet the uncovered part of the surface. The first and second material can differ, but can also be the same material. The first and second set of growth conditions can differ, but can also be the same. More specifically, it may be of practical use to choose two sets of growth conditions that have the same substrate temperature.

Figure 5:
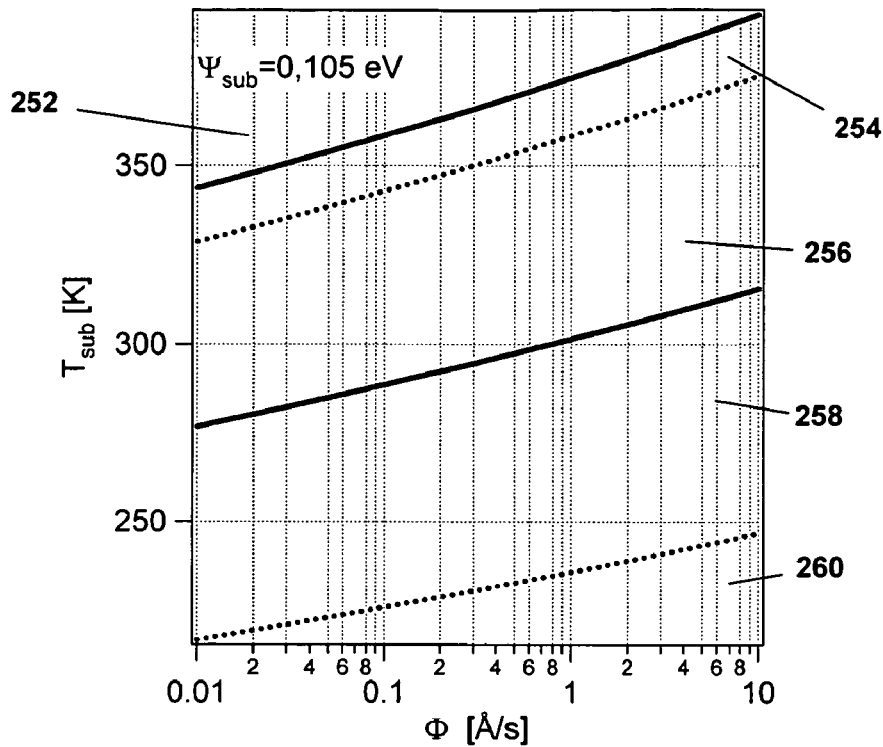
FIG. 5 is a graph of the growth/deposition parameters for different thin film materials having different nucleation behavior as can be used in the second embodiment of the present invention.

The second material and second set of growth conditions can also be chosen such that the second material nucleates in 3D topology on the substrate surface. An example of growth conditions for two different materials, perylene and pentacene, is given in FIG. 5. In FIG. 5, different regions in the growth conditions graph can be distinguished. In region 252 no or substantially no perylene, and no or substantially no pentacene nucleation occurs. In region 254 only pentacene 3D nucleation occurs. In region 256 only pentacene 2D nucleation occurs. In region 258 both perylene 3D nucleation and pentacene 2D nucleation occurs. In region 260 both perylene 2D nucleation and pentacene 2D nucleation occurs.

The particle-substrate interaction $\psi_{sub}$ is chosen to be equal for both materials, i.e., in the example given $\psi_{sub}$=0.105 eV. A patterned film can be grown by first nucleating isolated not- or ill-connected 3D perylene grains in the region where perylene nucleates in 3D topology. Next, pentacene can be grown, potentially at the same substrate temperature, such that pentacene nucleates in 2D topology at the substrate surface that was not yet covered with perylene. In the present example, there is temporal modulation of the thin film growth as first a first material is deposited and subsequently a second material is deposited, both materials having different nucleation properties. The spatial modulation or patterning is obtained automatically as the first material is grown such that no or substantially no perculated film is present yet and the second material is grown on the uncovered substrate in between the islands of first material.

Figure 6:
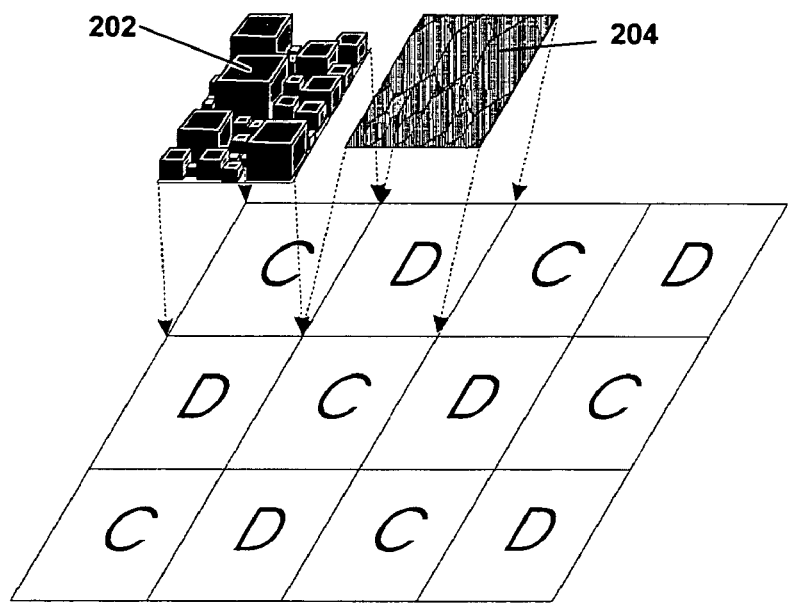
FIG. 6 is an illustration of a patterned thin film showing 3D growth in distinct regions and 2D growth in other distinct regions, as can be obtained using the second embodiment of the present invention.

A second example of the second embodiment includes the features and specifications of the first example, but additionally makes use of a patterned substrate surface as described in the first embodiment. In this way the particle-substrate interaction $\psi_{sub}$ is patterned to influence the nucleation mode of the first and the second material at a well-chosen first and second set of growth conditions. The latter allows to pattern material and their morphological and/or interfacial properties such that they do not have a random distribution, but that the distribution can be engineered. This is illustrated in FIG. 6.

The substrate is patterned in parts C and D. Part D is patterned such that $\psi_{sub,D}$ induces no or substantially no nucleation of the first material at the chosen first set of growth conditions, while part C has a $\psi_{sub,C}$ such that this first material will nucleate in 3D topology at the chosen first set of growth conditions thereby forming 3D grains 202. The second set of growth conditions will nucleate the second material in 2D topology on parts D if $\psi_{sub,D}$ is chosen appropriately, thereby forming 2D grains 204.

A third example of the second embodiment includes the features and characteristics of the second example of the second embodiment, in which $\psi_{sub}$ is patterned in two regions with $\psi_{sub,1}$ and $\psi_{sub,2}$ such that the first material at the first set of growth conditions nucleates in 2D topology on the region with $\psi_{sub,1}$ and does not or does not substantially nucleate on the region with $\psi_{sub,2}$, and the second material at the second set of growth conditions nucleates in 2D topology on the regions with $\psi_{sub,2}$, but whereby the nucleation type of the second material may be 3D nucleation, as determined by the material type and the growth conditions of this second material.

A fourth example comprises a first material at a first set of growth conditions that will nucleate in 2D or 3D topology at the given substrate surface, that may but does not need to be patterned such that this first material at those growth conditions only nucleates at certain regions and does not nucleate at other regions. The second material and the second set of growth conditions are then chosen such that this second material will nucleate in 2D or 3D topology substantially only on top of the nucleated grains of the first material, but not or substantially not on the regions of the substrate surface that are not covered with the first material.

A fifth embodiment includes all previous embodiments, but extends the principle to more than two materials, with or without more than one or two substrate surface treatments.

In the previous examples, a selection of different materials having different specific growth conditions, a selection of different specific growth conditions, and a selection specific substrate surface modulation by surface treatments are illustrated. The following example illustrates how the present embodiment can be used for solar cell applications. This example is given by way of illustration of the method of the second embodiment.

A specific example of the use of patterning of material and interface properties by the choice of two materials is the selection of a first material being an organic acceptor material, possibly absorbing light by creating an exciton in a certain wavelength range, and selection of a second material being an organic donor material, possibly absorbing light by creating an exciton in a different wavelength range than the first material, such that the interface of both materials is suited for exciton dissociation. This specific example is suited to make an organic solar cell. Using the methods described in the above examples for the second embodiment allows to control both percolation, interfacial area, exciton dissociation efficiency, and light absorption by proper choice of the materials, their growth conditions, and possibly also of the patterns of the substrate surface.

In a third embodiment of the present invention, the growth conditions for the film material are modulated for a chosen appropriate material and a chosen appropriate substrate surface treatment. The present embodiment relates to a method for patterning thin films and the patterned thin films thus obtained, whereby the method is related to modulation of the growth conditions during growth. In the present method thus a temporal modulation, i.e., a modulation of time is applied.

The growth conditions may typically be the substrate temperature and the deposition flux. Additionally, the deposition time can also be added to the growth conditions, although the latter does not influence the nucleation mode. The thin film material(s), the surface treatment(s), and the substrate material(s) that can be used in the present embodiment may be substantially identical and have similar features as those described and listed in the previous embodiments. The change of growth conditions can change the nucleation behavior during growth of the film, which can lead to a morphological patterning of the film, either randomly or not randomly. Patterning by modulation of the growth conditions during growth allows for patterning the surface roughness of the film.

An example of this modulation is by starting the growth of the film with growth conditions leading to 3D nucleation of the material on the substrate surface. The first set of growth conditions (which may be defined by the substrate temperature, the deposition flux, and the deposition time or the duration of the deposition) are chosen such that the 3D nuclei form isolated ill-connected or substantially not connected grains. After the duration of the deposition using the first set of growth conditions, a second deposition is performed using a second set of growth conditions.

The second set of growth conditions is chosen so that the growth conditions will nucleate the material in 2D topology on the substrate surface that was not yet covered by the material. This leads to a random pattern of 3D and 2D nucleated grains. Thus a temporal modulation of the growth conditions is performed that allows for obtaining a patterned surface roughness. For the deposition, either the same material or more than one material can be used. Furthermore, the substrate surface treatment can be patterned.

In a fourth embodiment, the present invention relates to a method for producing patterned thin films based on the modulation of the nucleation mode of at least one thin film material on at least one region of the substrate. The thin film material(s), the surface treatment(s), the substrate material(s), and the growth conditions that can be used in the present embodiment may be substantially identical and have similar features as those described and listed in the previous embodiments. In the present embodiment, the modulation may be performed by influencing at least one of the thin film material(s) used, the surface treatment of the substrate used, and/or the growth conditions used during deposition. In general, the production of the patterned thin film is obtained during a plurality, m, deposition steps. A deposition step refers to deposition of one or more materials during one uninterrupted time-step during which none of the deposition conditions have changed.

For each of the deposition steps i (i running from 1 to m) a thin film material $A_i$ is deposited. The thin film material may be any suitable material, such as organic molecules, that is capable of forming crystalline structures or structures that exhibit short-range order, i.e., in the range of nearest-neighbor molecular distances or longer.

The substrate surface is divided into p regions $P_i$ (i running from 1 to p). Each region is composed of one surface chemistry $SC_j$. In total, there are n different surface chemistries $SC_j$ on the substrate surface (j running from 1 to n). For each deposition step i the material $A_i$ is deposited, using a set of deposition parameters $\{Q_k\}_i$, where k is running from 1 to o, with o being the number of deposition parameters required to uniquely and completely define a deposition condition.

It is noted that as soon as material $A_i$ is deposited on some places on the substrate, those places will get a different surface chemistry corresponding to the properties of the deposited material $A_i$. In other words, depositing a material may increase the number of regions p present on the substrate surface and/or the number of surface chemistries $SC_j$ present. The nucleation mode of material $A_i$ on surface chemistry $SC_j$ using conditions $\{Q_k\}_i$ can be determined by comparing the supersaturation for a specific material $A_i$ at specific growth conditions $\{Q_k\}_i$ i.e., $\Delta\mu(A_i, \{Q_k\}_i)$ to the transition supersaturation $\Delta\mu_{tr,i,j}(A_i, SC_j)$.

$A_i$ will nucleate in 3D topology on $SC_j$ if $0<\Delta\mu(A_i, \{Q_k\}_i)<\Delta\mu_{tr,i,j}$ $A_i$ will nucleate in 2D topology on $SC_j$ if $\Delta\mu(A_i, \{Q_k\}_i)>=\Delta\mu_{tr,i,j}$ $A_i$ will not nucleate at all or substantially not nucleate if $\Delta\mu(A_i, \{Q_k\}_i)<0$ and $\Delta\mu(A_i, \{Q_k\}_i)<\Delta\mu_{tr,i,j}$ The result of the above process is a deposit on the substrate. This deposit consists of grains of one or more materials. Each grain can have 2D or 3D topology, and can or cannot be connected to a neighboring grain (i.e., both laterally and vertically), which may be of the same or of different material. The density of grains is determined by the $\{Q_k\}_i$. One of the deposition parameters $Q_k$ relevant to determine the density of grains is time.

It is to be noted that the nucleation mode is independent of time. The properties of the final deposit will be similar on all regions $P_i$ that have the same surface chemistry $SC_j$. The property of the deposit on region $P_i$ will depend on the properties of the materials $A_i$ that have nucleated on $P_i$, on their nucleation modes, their nucleation densities, and on the properties of interfaces between two thin film materials $A_i$ and $A_j$. Of particular importance amongst others, is the notion that 3D nucleated deposits can be controlled not to have percolation paths, (i.e., the different 3D grains are not touching each other), while 2D nucleated deposits can be controlled to form continuous deposits where all grains are touching neighboring grains. Any physical property that can be transported (e.g., electric charge, heat, light, . . . ) will therefore be transported differently or not at all in the 3D nucleated deposit when compared to the 2D nucleated deposit. The surfaces of any substrate can be engineered to have p regions $P_i$ spatially distributed across the substrate. By proper designing a combination of thin film materials $\{A_i\}$, their deposition parameters $\{\{Q_k\}_i\}$ and the surface chemistries $\{SC_j\}$, the spatial distribution of physical properties of the deposit on the substrate can be controlled.

By way of a non-limiting example, several applications of the present embodiment are illustrated in the following examples.

In a first example, one thin film material is deposited and the number of different regions on the substrate and the different surface chemistries is two. The deposition parameters $\{Q_k\}_1$ are chosen together with surface chemistries $SC_1$ and $SC_2$ such that thin film material $A_1$ will nucleate in 2D topology on region with surface chemistry $SC_1$ and will nucleate in 3D topology or not or substantially not on region with surface chemistry $SC_2$. The deposit will grow substantially continuously on surface chemistry $SC_1$ and discontinuously on surface chemistry $SC_2$. This can be used to pattern the active area of an organic thin-film transistor, in which all variables are chosen such to grow an organic semiconductor (e.g., pentacene) having 2D topology in the transistor channel and 3D topology outside the channel. In this way, current can flow through the individual transistor channels, but no parasitic current can flow from one transistor channel to another transistor through the semiconductor deposit.

In a second example, two materials are deposited at growth conditions $\{\{Q_k\}_1, \{Q_k\}_2\}$ on one region having one surface chemistry. The different influencing parameters can be chosen such that the thin film material $A_1$ grows according to 3D nucleation on surface chemistry $SC_1$, while the thin film material $A_2$ grows according to 2D nucleation. In this case, the thin film material $A_2$ will form a substantially continuous deposit that connects to the isolated 3D grains of thin film material $A_1$. This can be used in organic bulk hetero-junction solar cells. There, the thin film material $A_1$ can be the donor material of which the conditions are chosen such that all grains have a certain statistically distributed size and density, but are isolated from each other (i.e., 3D nucleation leading to island growth). Depositing 2D nucleated thin film material $A_2$ which is an acceptor material next will fill up the empty space between the thin film material $A_1$ grains, and the heterojunctions between the thin film materials $A_1$ and $A_2$ will form donor/acceptor interfaces which can be capable of splitting excitons to produce free charges.

It is to be noted that it might be possible that thin film materials $A_1$ and $A_2$ are deposited at the same time, if the deposition conditions can be chosen such that the deposition parameters related to the substrate (e.g., substrate temperature) are common to both sets $\{Q_k\}_1$ and $\{Q_k\}_2$. It is also to be noted that $A_1$ and $A_2$ can in principle also be the same material. By applying two different deposition conditions, the morphology of the deposit can be statistically controlled at the microscale.

In a third example, the number of materials deposited is two and the number of regions and surface chemistries on the substrate also is two. The growth conditions $\{\{Q_k\}_1, \{Q_k\}_2\}$, the thin film materials $\{A_1, A_2\}$ and the surface chemistries $\{SC_1, SC_2\}$ can be chosen such that thin film material $A_1$ with deposition parameters $\{Q_k\}_1$ grows in 2D topology on a region with surface chemistry $SC_1$ and not or substantially not or in 3D topology with a very low nucleation density on a region with surface chemistry $SC_2$, while thin film material $A_2$ with deposition parameters $\{Q_k\}_2$ grows according to 2D nucleation in a region having surface chemistry $SC_2$. This can be used in organic ambipolar transistors or in organic lasers. In that case, thin film material $A_1$ can be an electron transporting material, while thin film material $A_2$ can be a hole transporting material (or vice versa).

The substrate can be patterned in two regions such that region $P_1$ with surface chemistry $SC_1$ and region $P_2$ with surface chemistry $SC_2$ form alternating lines stretching from one contact, which can be electron-injecting, to another contact, which can be hole-injecting. Both holes and electrons can now flow in between contacts, one charge type through thin film material $A_1$ and the other through thin film material $A_2$. If the contacts are part of a transistor, this transistor will work in an ambipolar way.

If thin film materials $A_1$ and $A_2$ are designed such that electrons and holes can recombine to form an exciton in one of the two materials close to the interface between the two thin film materials, a light-emitting transistor may be created. If an optical feedback structure is provided to this light-emitting transistor, an organic laser may be created. One example of such an optical feedback structure is an organic Distributed Bragg Reflector (DBR) or grating. If the indices of refraction of thin film materials $A_1$ and $A_2$ are different, they may allow for designing such a DBR by varying the width of the lines of regions $P_1$ and $P_2$.

It will be obvious for the person skilled in the art that the above examples are only given by way of illustration and that a large number of other applications exist. Other arrangements for accomplishing the objectives of the method for patterning thin film growth on a substrate will be obvious for those skilled in the art. It is to be understood that although preferred embodiments, specific examples and configurations, as well as materials, have been discussed herein for the methods according to the present invention, various changes or modifications in form and detail may be made without departing from the scope and spirit of this invention.

The invention claimed is:

1. A method for the production of a patterned film on a substrate, comprising:
   growing a first film material on the substrate, wherein the growing of the first film material includes depositing 3D nuclei of the first film material on the substrate; and
   growing a second film material on the substrate, wherein the growing of the second film material includes depositing 2D nuclei of the second film material on the substrate, and wherein the first film material is substantially the same as the second film material; and
   before growing the film materials, applying a surface treatment to a first region of the substrate, such that the first region has a different interaction energy with respect to the film material than a second region of the substrate.

2. A method according to claim 1, wherein the surface treatment is performed using a chemical selected from the group consisting of octadecyl trichlorosilane (OTS), 11-bromoundecyl trichlorosilane (BUTS), 10-undecenyl trichlorosilane (UETS), 11-cyanoundecyl trichlorosilane (CUTS), and heptadecafluoro-1,1,2,2-tetrahydrodecyl trichlorosilane (FDTS).

3. A method according to claim 1, wherein the surface treatment is a UV-ozone treatment.

4. A method for the production of a patterned film on a substrate, comprising:
   applying a surface treatment to at least a portion of the substrate, such that a first region of the substrate has a different interaction energy than a second region of the substrate with respect to at least one film material; and
   growing the film material on the substrate under preselected growth conditions, wherein the growth conditions are selected such that 2D nuclei of the film material are deposited on the substrate in the first region, and such that, substantially simultaneously, 2D nuclei of the film material are not substantially deposited on the substrate in the second region.

5. A method according to claim 4, wherein, under the preselected growth conditions, there is substantially no nucleation on the substrate in the second region.

6. A method according to claim 4, wherein, under the preselected growth conditions, 3D nuclei of the film material are deposited on the substrate in the second region.

7. A method according to claim 4, wherein the preselected growth conditions include a preselected substrate temperature $T_{sub}$ and a preselected deposition flux $\Phi$.

8. A method according to claim 4, wherein the surface treatment is applied to randomly spread locations over the substrate.

9. A method according to claim 4, wherein the film material consists essentially of a single film material.

10. A method according to claim 4, wherein the film material comprises at least a first film material and a second film material different from the first film material, and wherein the growth conditions are selected such that the first film material forms 2D nuclei on the substrate in the first region and the second film material forms 3D nuclei on the substrate in the second region.

11. A method according to claim 6, wherein the deposition of the film material forms an interface between the first and second regions, and wherein the interface is suited for exciton dissociation in a solar cell device.

12. A method according to claim 6, wherein the film material in the second region forms a non-conductive film region.

13. A method according to claim 12, wherein the film material in the first region forms a conductive film region.

14. A method according to claim 4, wherein the substrate is composed of a material selected from the group consisting of an organic semiconductor material, a metal, a dielectric material, an electrically isolating material, a glass, a polyester, and a transparent conductive oxide.

15. A method according to claim 4, wherein the patterned film is selected from the group consisting of crystalline and polycrystalline.

16. A method according to claim 4, wherein the film material comprises an organic semiconductor material.

17. A method according to claim 16, wherein the organic semiconductor material comprises small organic molecules.

18. A method according to claim 4, wherein the surface treatment includes silanization.

19. A method according to claim 18, wherein the surface treatment is performed using a chemical selected from the group consisting of octadecyl trichlorosilane (OTS), 11-bromoundecyl trichlorosilane (BUTS), 10-undecenyl trichlorosilane (UETS), 11-cyanoundecyl trichlorosilane (CUTS), and heptadecafluoro-1,1,2,2-tetrahydrodecyl trichlorosilane (FDTS).

20. A method according to claim 4, wherein the surface treatment is a UV-ozone treatment.

21. A method for the production of a patterned film on a substrate, comprising:
   growing a first film material on the substrate under first preselected growth conditions, wherein the first growth conditions are selected such that 3D nuclei of the first film material are deposited on the substrate; and
   growing a second film material on the substrate under second preselected growth conditions different from the first growth conditions, wherein the second growth conditions are selected such that 2D nuclei of the second film material are deposited on the substrate, wherein the first preselected growth conditions are selected such that the first film material forms substantially unconnected 3D grains and the second preselected growth conditions are selected such that the second film material substantially connects the 3D grains.

22. A method for the production of a patterned film on a substrate, comprising:
   applying a surface treatment to a first region of the substrate, such that the first region has a different interaction energy than a second region of the substrate with respect to at least one film material; and
   forming a film of the at least one film material on the substrate by performing a plurality of deposition steps, each step being performed under respective preselected growth conditions;
   wherein the growth conditions are selected such that, during at least one deposition step, a first nucleation mode of the film material on the substrate in the first region is different from a second nucleation mode of the film material on the substrate in the second region; and wherein the growth conditions are selected such that the nucleation mode of the film material on one of the regions during one of the deposition steps is different from the nucleation mode of the film material in that region during a different deposition step.

23. A method for the production of a patterned film on a substrate, comprising:

applying a surface treatment to at least a portion of the substrate, such that a first region of the substrate has a different interaction energy than a second region of the substrate with respect to at least one film material; and growing a first film material on the substrate under first preselected growth conditions, wherein the growth conditions are selected such that nuclei of the first film material are deposited on the substrate in the first region according to a first nucleation mode and such that, substantially simultaneously, nuclei of the first film material are not substantially deposited on the substrate in the second region; and growing a second film material on the substrate under second preselected growth conditions, the second film material being different from the first film material, wherein the growth conditions are selected such that nuclei of the second film material are deposited on the substrate in the second region according to the first nucleation mode and such that, substantially simultaneously, nuclei of the second film material are not substantially deposited on the substrate in the first region.

24. A method according to claim 23, wherein the first nucleation mode is a 2D nucleation mode.

25. A method according to claim 23, wherein the first nucleation mode is a 3D nucleation mode.

* * * * *